(12) United States Patent
Kanoh et al.

(10) Patent No.: US 7,719,184 B2
(45) Date of Patent: May 18, 2010

(54) ORGANIC EL ELEMENT HAVING A PROTECTIVE LAYER

(75) Inventors: Keigo Kanoh, Yamato (JP); Mitsuo Morooka, Kawasaki (JP); Taro Hasumi, Yamato (JP); Hiromi Fukuoka, Yamato (JP); Masaya Watanabe, Yamato (JP)

(73) Assignee: Kyocera Corporation, Kyoto (JP)

( * ) Notice: Subject to any disclaimer, the term of this patent is extended or adjusted under 35 U.S.C. 154(b) by 844 days.

(21) Appl. No.: 11/460,818

(22) Filed: Jul. 28, 2006

(65) Prior Publication Data

US 2007/0176545 A1 Aug. 2, 2007

(30) Foreign Application Priority Data

Jul. 29, 2005 (JP) ............................. 2005-220976
May 29, 2006 (JP) ............................. 2006-148927

(51) Int. Cl.
*H05B 33/00* (2006.01)
*H05B 33/06* (2006.01)

(52) U.S. Cl. ...................... 313/506; 313/504; 313/503; 428/690; 428/917; 257/40

(58) Field of Classification Search ......... 313/504–506; 428/690, 917

See application file for complete search history.

(56) References Cited

U.S. PATENT DOCUMENTS 7,276,453 B2 * 10/2007 Truong et al. ................ 438/739
2003/0137242 A1 * 7/2003 Seki ........................... 313/506

FOREIGN PATENT DOCUMENTS

JP 2001-185363 7/2001
JP 2004-296297 10/2004

* cited by examiner

*Primary Examiner*—Sikha Roy
(74) *Attorney, Agent, or Firm*—Hogan & Hartson LLP

(57) ABSTRACT

Provided is an organic EL element including: a first electrode 13; a protection layer 15 that is formed on the first electrode 13 and has an opening portion through which the first electrode 13 is exposed; an insulation layer 17 that is formed on the protection layer 15; an organic layer 19 that is formed over the insulation layer 17 and the first electrode 13 exposed through the opening portion, and includes an emission layer; and a second electrode 21 formed on the organic layer 19, wherein a film thickness of the protection layer 15 is less than that of the organic layer 19.

11 Claims, 10 Drawing Sheets

ORGANIC EL ELEMENT HAVING A PROTECTIVE LAYER

CROSS-REFERENCE TO RELATED APPLICATIONS

The present application claims priority under 35 U.S.C. §119 to Japanese Patent Application No. 2005-220976, filed Jul. 29, 2005 and Japanese Patent Application No. 2006-148927, filed May 29, 2006. The contents of this application are incorporated herein by reference in their entirety.

BACKGROUND OF THE INVENTION

1. Field of the Invention

The present invention relates to an organic EL element.

2. Description of the Related Art

In an organic electroluminescence (EL) element, an electric field is applied to an organic fluorescent compound so as to be excited to emit light. Characteristics of the organic EL element include self-illumination, a wide viewing angle, a high response speed, a low driving voltage, and full color. The organic EL element has currently been put to practical use, and may apply to a flat color display device such as a compact display panel, an out-door screen, or a screen for a personal computer or a television set.

The organic EL element has a structure in which an organic layer having a luminescence characteristic is interposed between two electrodes. When a DC voltage is applied to the two electrodes, a hole is injected from a positive electrode to the organic layer, and an electron is injected from a negative electrode to the organic layer. According to the electric field generated in response to the applied voltage, these carriers are transferred inside an organic emission layer, and thereby carrier recombination occurs.

A part of energy emitted when the electron and the hole are recombined is used to excite a luminescent molecule. When the excited luminescent molecule emits energy and thus returns to a ground state, a certain portion of the energy is emitted in the form of a photon. This is an emission principle of the organic EL element.

When manufacturing the organic EL element, a driving element such as a TFT, which is used to drive the organic EL element, a conductive pattern and the like are formed on a substrate (i.e., a glass substrate), and then they are covered by a flattening film. Thereafter, a first electrode, an insulation layer, an emission layer, and a second electrode are formed in this order on the flattening film.

However, while the first electrode is subjected to the above processes, process damage may occur, or dust may be attached onto the first electrode. This affects to a characteristic of the organic EL element, which leads to deterioration in emission quality.

To cope with the above problem, a technique has been proposed in which the organic EL element is produced by sequentially laminating a first electrode, a protection film, an emission layer composed of an organic material, and a second electrode on a substrate, and by removing the protection film existing in a pixel area on the first electrode before the emission layer is laminated (Japanese Unexamined Patent Publication No. 2001-185363). According to this technique, the protection film has a film thickness of 1 μm, and the organic layer has a film thickness of 1,250 Å, where the film thickness of the protection film is greater than that of the organic layer.

SUMMARY OF THE INVENTION

According to an aspect of the present invention, there is provided an organic EL element comprising: a first electrode; a protection layer that is formed on the first electrode and has a first opening portion through which the first electrode is exposed; an insulation layer formed on the protection layer and having a second opening portion in a region corresponding to the first opening portion of the protection layer; an organic layer that is formed over the insulation layer and the first electrode exposed through the first opening portion, and includes an emission layer; and a second electrode formed on the organic layer. In this case, a film thickness of the protection layer is less than that of the organic layer.

According to another aspect of the present invention, there is provided an organic EL element comprising: a first electrode; a protection layer formed on the first electrode and having a concave portion; an insulation layer formed on the protection layer and having an opening portion through which the protection layer is exposed; an organic layer that is formed over the insulation layer and the protection layer through which the opening portion of the insulation layer, and includes an emission layer; and a second electrode formed on the organic layer. In this case, a depth of the concave portion is less than a film thickness of the organic layer.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, an organic EL element and a manufacturing method thereof according to exemplary embodiments of the present invention will be described in detail with reference to the accompanying drawings. The present invention is not limited to the following descriptions, but various changes may be made therein without departing from the gist of the invention. To facilitate understanding, each element may be shown in a different scale from its actual scale.

First Embodiment

Figure 1:
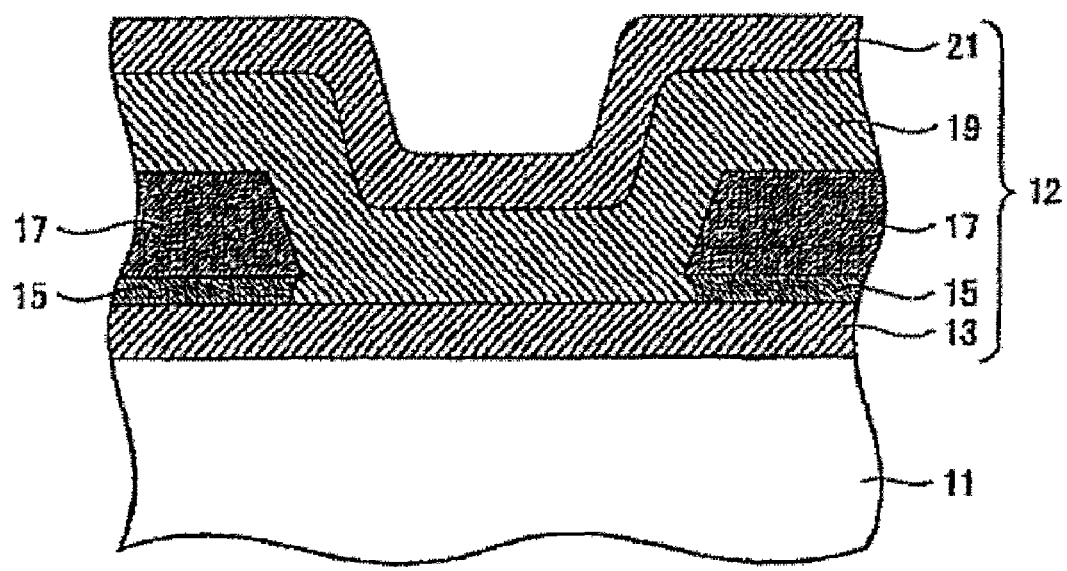
FIG. 1 is a cross-sectional view showing a structure of an organic EL element according to a first embodiment of the present invention.

FIG. 1 is a cross-sectional view showing a schematic structure of an organic EL element according to a first embodiment of the present invention. As illustrated in FIG. 1, the organic EL element includes a substrate portion 11 and an organic electroluminescence element portion 12 on the substrate portion 11. The substrate portion 11 includes a substrate such as a glass substrate, a driving element such as a TFT used to drive the organic electroluminescence element portion 12, a conductive pattern, and a flattening layer which covers the driving element and the conductive pattern. The organic EL element employs a top emission type structure in which light is obtained from a top surface side of the organic electroluminescence element portion 12.

As illustrated in FIG. 1, the organic electroluminescence element portion 12 includes a lower electrode (anode electrode) 13 that is a first electrode formed on the substrate portion 11, a protection layer 15 that is formed on the lower electrode 13. The protection layer 15 has an opening portion where a part of the lower electrode 13 is exposed from the protection layer 15. The organic electroluminescence element portion 12 further includes, a interlayer-insulation layer 17 that is formed on the protection layer 15, an organic electroluminescence layer (organic layer) 19 that is formed on the exposed region of the lower electrode 13 and the interlayer-insulation layer 17, and an upper electrode (cathode electrode) 21 that is a second electrode formed on the organic electroluminescence layer.

The lower electrode (anode electrode) 13 is formed of a material having a high light reflectance such as aluminum (Al) or its alloy, an alloy of aluminum (Al) and neodymium (Nd), an alloy of aluminum (Al) and yttrium (Y), or silver (Ag) or its alloy. Since the lower electrode 13 is formed of the material having a high light reflectance, light acquisition efficiency can be enhanced in the top emission type organic EL element, and light emitted from the organic electroluminescence layer 19 can be effectively utilized.

In the process of manufacturing the organic electroluminescence element portion 12, which will be described below, the protection layer 1S protects the lower electrode 13 from process damage after the lower electrode 13 is formed until the organic electroluminescence layer 19 is formed.

In this case, the protection layer 15 is required to be formed of a material by which etching can be selectively performed by using wet-etching. Further, in the process of forming the interlayer-insulation layer 17 as to be described below, the protection layer 15 is preferably formed of a durable material capable of protecting the lower electrode 13 from the process damage. That is, the protection layer 15 is preferably formed of a material that is durable against a developing solution used to pattern the interlayer-insulation layer 17.

Preferably, the protection layer 15 has a good adherence property with respect to the lower electrode 13. Thus, a problem caused when the protection layer 15 is peeled off can be prevented satisfactorily. For example, the material that meets the requirement for the protection layer 15 may be molybdenum (Mo) or its alloy.

Since the protection layer 15 is formed of molybdenum (Mo) or its alloy, when the lower electrode 13 is formed of aluminum or its alloy, the protection layer 15 can have a good adherence property with respect to the lower electrode 13. Accordingly, a problem caused when the protection layer 15 is peeled off can be prevented satisfactorily.

The material forming the protection layer 15 is not limited to a metal material. Thus, an insulation material such as silicon nitride may be used.

The organic electroluminescence layer 19 includes an emission layer that uses an organic material as an emission material. The organic electroluminescence layer 19 may employ either a single layer structure or a multilayer structure in which layers are laminated based on functions. For example, in the case of single layer structure in which the organic electroluminescence layer 19 is formed to be a single layer having only the emission layer, the emission layer may be formed of a host material in which a dopant material having a luminescent characteristic is doped, having a hole transport characteristic and an electron transport characteristic. Also, the emission layer may be formed of a material having a hole transport characteristic, an electron transport characteristic and a luminescent characteristic. With this single layer structure, the process of forming element can be simplified. In addition, the organic EL element can be produced at a low price.

On the other hand, for example, when the organic electroluminescence layer 19 employs the multilayer structure, the organic electroluminescence layer 19 comprising the emission layer further comprises a single layer or a plurality of layers selected from among a hole transport layer, a hole injection layer, a hole blocking layer, an electron transport layer, an electron injection layer, and an electron blocking layer. For example, in the case of multilayer structure in which the organic electroluminescence layer 19 is composed of the emission layer, the hole blocking layer and the electron transport layer, the hole blocking layer is formed between the lower electrode 13 functioning as an hole injection electrode and the electron transport layer, in order to control the amount of charge carriers injected from the lower electrode 13 and the upper electrode 21 and to have the substantially same density of both the hole and the electron in a portion where they are recombined. With this structure, emission efficiency can be improved. In the case of multilayer structure in which the organic electroluminescence layer 19 is composed of the emission layer, the electron blocking layer and the hole transport layer, the electron blocking layer may be formed between the upper electrode 21 functioning as an electron injection electrode and the hole transport layer.

In order to obtain light from the top surface side of the organic electroluminescence element portion 12, the upper electrode 21 is formed of a transparent conductive material such as indium tin oxide (ITO) or tin oxide.

In the organic EL element having the aforementioned structure according to the present embodiment, the protection layer 15 has a film thickness less than that of the organic electroluminescence layer 19. Thus, the disruption of the organic electroluminescence layer 19 caused by a step difference at the opening portion of the protection layer 15 can be effectively prevented. As a result, the lower electrode 13 is prevented from being exposed through a disrupted portion of the organic electroluminescence layer 19. Further, the upper electrode 21 and the lower electrode 13 are prevented from short-circuiting through the disrupted portion in a satisfactory manner.

In addition, in the organic EL element having the aforementioned structure according to the present embodiment, the protection layer 15 has a film thickness less than that of the upper electrode 21. Thus, the upper electrode 21 is prevented from disconnection caused by the step difference at the opening portion of the protection layer 15. Further, the upper electrode 21 is effectively prevented from poor conductivity caused thereby.

In the organic EL element having the aforementioned structure according to the present embodiment, the protection layer 15 may have a film thickness of about 5 nm to 500 nm, preferably, about 5 nm to 100 nm. In terms of preventing disruption of the organic electroluminescence layer 19 or disconnection of the upper electrode 21, a thickness of the interlayer-insulation layer 17 does not matter so much for the following reasons. That is, since a film thickness of the interlayer-insulation layer 17 is thin near the opening portion of the protection layer 15, and a surface of the interlayer-insulation layer 17 near the opening portion has a relatively gentle slope, the organic electroluminescence layer 19 or the upper electrode 21 is satisfactorily attached to this portion. Therefore, the thickness of the interlayer-insulation layer 17 does not matter so much.

Further, in the organic EL element having the aforementioned structure according to the present embodiment, the protection layer 15 is located such that a lateral side of the opening portion thereof is deviated to outside a lateral side of the interlayer-insulation layer 17. In this case, an indentation at the lateral side of the opening portion of the protection layer 15 is formed. In this indentation, the amount of positional deviation between the lateral side of the opening portion and the lateral side of the interlayer-insulation layer 17 is determined to be 1 μm or less. Accordingly, the disruption of the organic electroluminescence layer 19 and the disconnection of the upper electrode (cathode electrode) 21 which are caused by the indentation formed near the opening portion of the protection layer 15 are effectively prevented. Further, poor conductivity caused thereby can be effectively prevented. When the amount of positional deviation is no more than 1 μm, the organic electroluminescence layer 19 and the upper electrode 21 become easy to fill in the indentation near the opening portion of the protection layer 15. Thus, the organic electroluminescence layer 19 and the upper electrode 21 can be restricted from peeling off around the indentation. Moreover, since the interlayer-insulation layer 17 near the opening portion is satisfactorily supported by the organic electroluminescence layer 19 and the upper electrode 21 in the indentation, shape deformation of the interlayer-insulation layer 17 can be effectively avoided.

Accordingly, in the organic EL element according to the present embodiment, quality deterioration caused by process damage during manufacturing can be avoided by the protection layer 15. Further, the disruption of the organic electroluminescence layer 19 and the disconnection of the upper electrode 21 which are caused by the step difference and the indentation of the protection layer 15 can be effectively avoided. Furthermore, poor conductivity of the upper electrode 21 caused thereby can be effectively avoided, realizing a high quality organic EL element.

A driving method of the present invention may be either a passive matrix method or an active matrix method. In addition, a structure of the present invention may be a bottom emission type structure in which light is obtained through the substrate portion.

Now, a manufacturing method of the organic EL element according to the above-mentioned embodiment will be described with reference to the accompanying drawings.

Figure 2:
FIGS. 2 to 6, 7A, and 7B are cross-sectional views explaining a manufacturing method of an organic EL element according to the first embodiment of the present invention.

First, the substrate (i.e., a glass substrate) is prepared, and the driving element such as a switching TFT, the conductive pattern and the like are formed on the substrate, and then a flattening insulation layer covers the driving element, the conductive pattern and the like, thereby the substrate portion 11 illustrated in FIG. 2 is formed.

Figure 3:
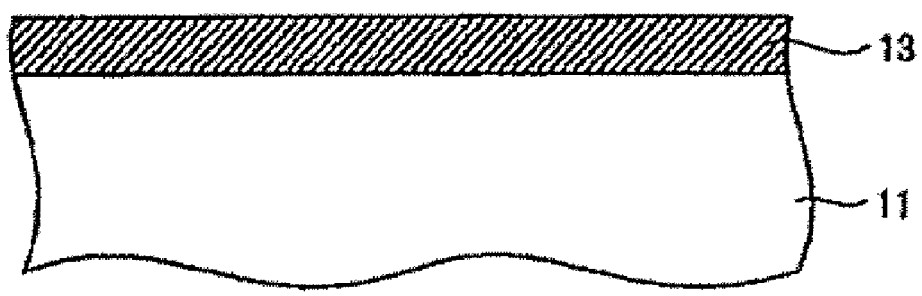

Next, as illustrated in FIG. 3, for example, aluminum (Al) film as the lower electrode 13 is formed on the substrate portion 11.

Figure 4:
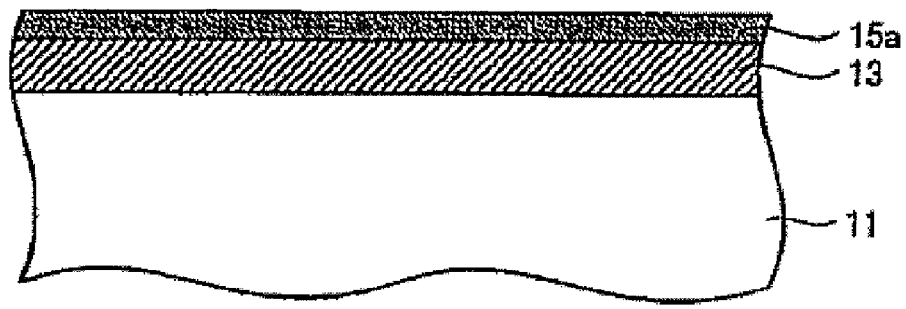

Subsequently, as illustrated in FIG. 4, for example, a molybdenum (Mo) film as a protection-material layer 15a is formed on the lower electrode 13. In this process, a film thickness of the protection-material layer 15a is less than that of the upper electrode 21 which is to be formed later.

As a result, disruption of the organic electroluminescence layer 19 formed in a later process, disconnection of the upper electrode 21, and poor conductivity of the upper electrode 21 can be effectively prevented when side etching of the protection-material layer 15a takes place in the etching process of the protection-material layer 15a. Further, the film thickness of the protection-material layer 15a is preferably 5 nm to 500 nm, more preferably 5 nm to 100 nm.

Since the lower electrode 13 and the protection-material layer 15a are formed by combining aluminum (Al) and molybdenum (Mo), the lower electrode 13 can have a good adhesive property with respect to the protection-material layer 15a, and a problem caused when the protection-material layer 15a is peeled off can be effectively prevented. With this combination, the protection-material layer 15a can be formed in a sputtering method by only replacing a chamber after the lower electrode 13 is formed in the sputtering method. Thus, the lower electrode 13 and the protection-material layer 15a can be effectively formed.

Figure 5:
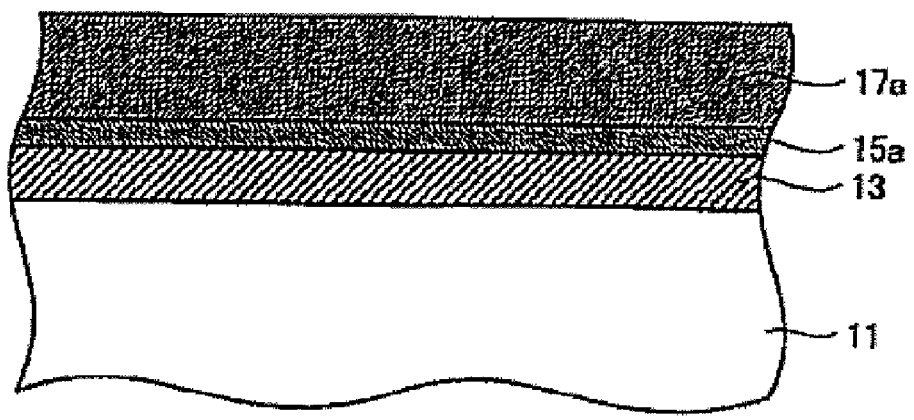
Figure 6:
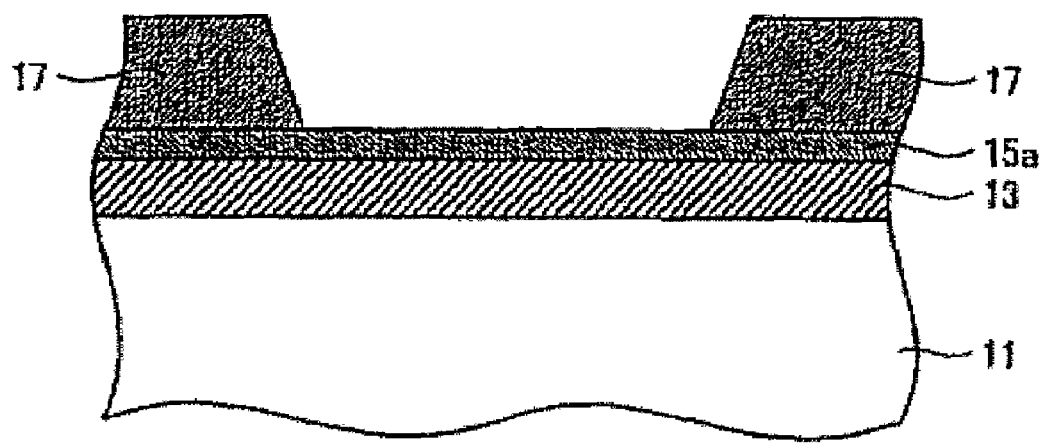

Next, as illustrated in FIG. 5, an insulation material layer 17a is formed on the protection-material layer 15a. Then, the insulation material layer 17a is patterned in etching by using the protection-material layer 15a as a stopper, and as illustrated in FIG. 6, the interlayer-insulation layer 17 having an opening portion corresponding to a pixel area is formed on the protection-material layer 15a. That is, the opening portion is formed by partially removing the insulation material layer 17a using a general photolithography technique, thereby obtaining the pixel area. In this case, the interlayer-insulation layer 17 is patterned such that its film thickness decreases near the opening portion. In order for the interlayer-insulation layer 17 to have this structure, positive resist material (i.e. acrylate resin) may be used as material of the insulation material layer 17a. When the insulation material layer 17a formed of the positive resist material is irradiated by light, and an irradiated portion is removed, thereby the opening portion of the insulation material layer 17a is formed. However, since light hardly reaches a lower side (the substrate portion 11 side) of the insulation material layer 17, the opening portion of the insulation material layer has an opening area narrower at its lower side than its upper side. As a result, a thickness of the interlayer-insulation layer 17 is gradually decreased near the opening portion.

Due to a low durability against a developing solution (an etchant) used to remove the insulation material layer 17a, the lower electrode 13 formed of aluminum (Al) or its alloy is dissolved in the developing solution. However, in the present embodiment, the protection-material layer 15a that is durable against the developing solution is formed on the lower electrode 13.

Accordingly, the lower electrode 13 is scarcely dissolved in the developing solution even in the process of removing the insulation material layer 17a, and a surface of the lower electrode 13 is restrained from becoming rough. Therefore, even after the process of the removing the insulation material layer 17a, the surface of the lower electrode 13 can maintain to be satisfactorily flattened as much as when the lower electrode 13 is formed. Further, darkening can be effectively prevented when an electrical short occurs between electrodes.

Although the protection-material layer 15a is removed in the following process, since the protection-material layer 15a covers over the lower electrode 13 until before the organic electroluminescence layer 19 is formed, the lower electrode 13 can be prevented from deterioration in its characteristic caused by an oxide film formed on its surface.

Figure 7A:
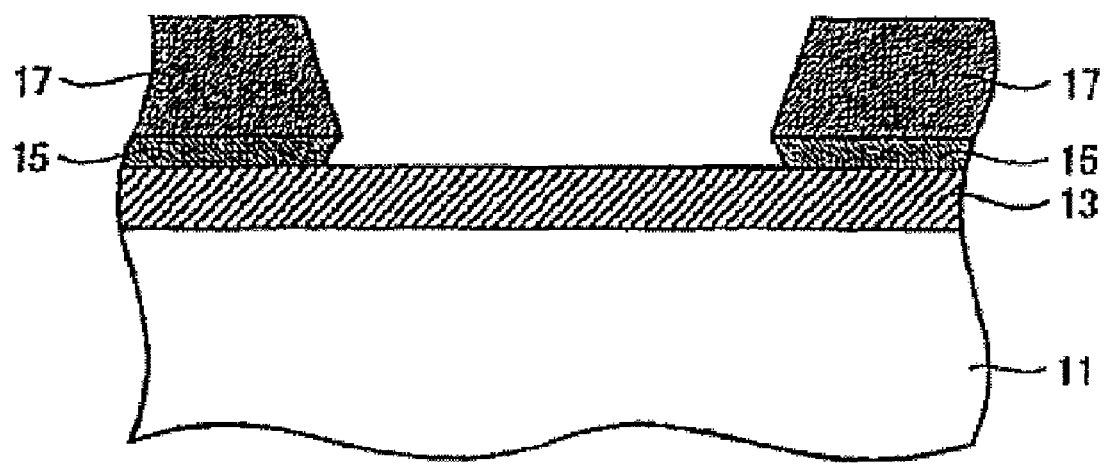

Subsequently, as illustrated in FIG. 7A, a lower side of the pixel area, that is, the protection-material layer 15a at the lower side of the opening portion, is selectively removed in wet-etching by using the interlayer-insulation layer 17 as a mask, and an opening portion is formed in the protection-material layer 15a by exposing the surface of the lower electrode 13, thereby forming the protection layer 15. It is desirable that an etchant used to remove the protection-material layer 15a in selective etching has a selection ratio greater than 10. By using the etchant having its selection ratio greater than 10, the protection-material layer 15a can be selectively removed at only a desirable portion without nearly deforming shapes of the interlayer-insulation layer 17 and the lower electrode (anode electrode) 13.

An etchant having its selection ratio in the range of 20 to 30 is more preferably used. By using the etchant, the protection-material layer 15a can be further satisfactorily removed at only a desirable portion. For example, as for the etchant that is used for selectively etching the protection-material layer 15a formed of molybdenum (Mo), a mixed acid may be used which contains nitric acid of 15 wt %~35 wt %, acetic acid of 25 wt %~45 wt %, and phosphoric acid of 0.1 wt %~5 wt %. Such a mixed acid may be CMK123 (nitric acid:acetic acid: phosphoric acid=26:36:2).

Figure 7B:
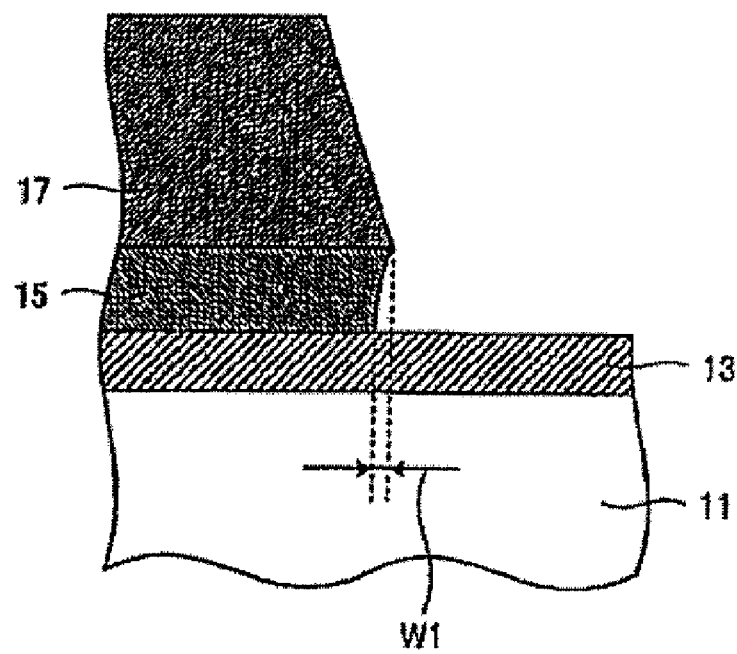

As illustrated in FIG. 7B, the protection layer 15 formed by selectively removing the protection-material layer 15a has a side etching width W1 of 1 μm or less. The side etching width W1 can be adjusted by selecting a film thickness of the protection-material layer 15a or by selecting an etchant. For example, when the aforementioned CMK123 is used as the etchant, the side etching width W1 can be 1 μm or less by performing wet-etching in a shower manner, a dip manner, or a paddle manner for an etching time of 10 to 30 seconds. By allowing the side etching width W1 to be 1 μm or less, the disruption of the organic electroluminescence layer 19 and the disconnection of the upper electrode 21 which are caused by the indentation of the protection layer 15 formed by the side etching can be effectively prevented, and poor conductivity of the upper electrode 21 caused thereby can be effectively prevented. Further, when the side etching width W1 is 1 μm or less, the organic electroluminescence layer 19 and the upper electrode 21 become easy to fill in the indentation near the opening portion of the protection layer 15. Thus, the organic electroluminescence layer 19 and the upper electrode 21 can be restricted from peeling off around the indentation. Furthermore, shape deformation of the interlayer-insulation layer 17 which is caused by the indentation can be effectively avoided.

Figure 7C:
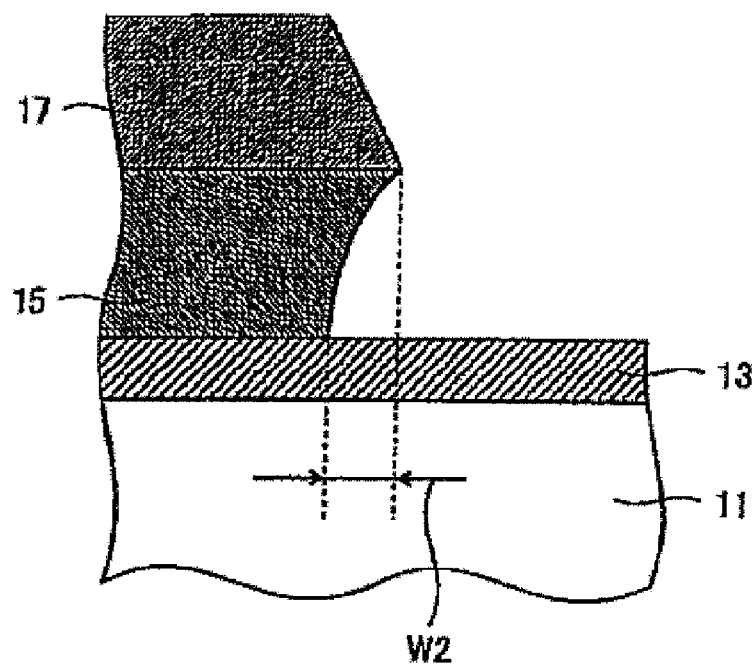
FIGS. 7C, 7D and 7E are cross-sectional views explaining a manufacturing method of a known organic EL element.
Figure 7D:
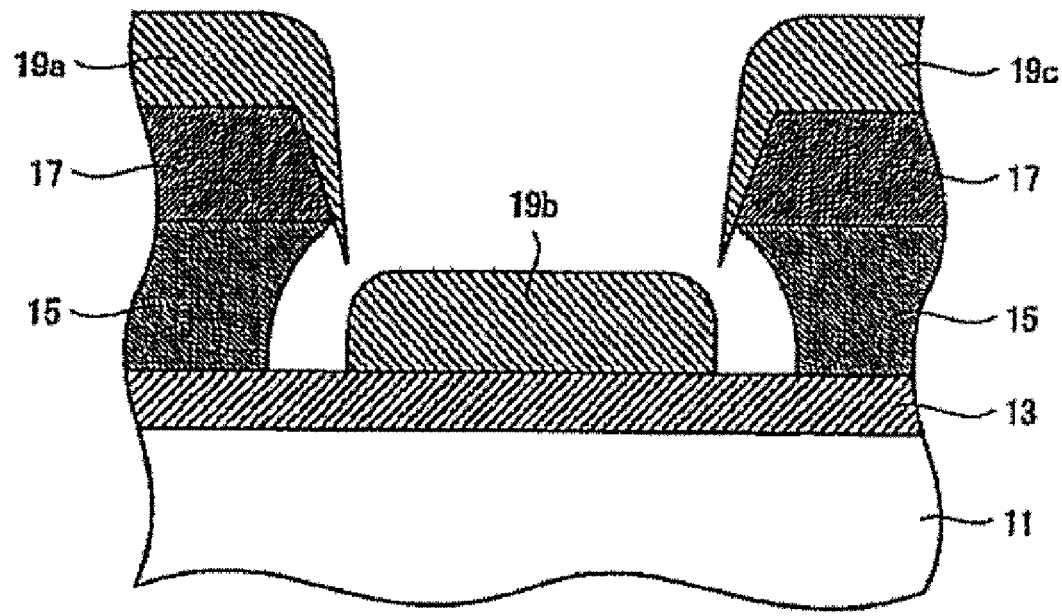

In the case that the film thickness of the protection layer 15 is greater than that of the organic electroluminescence layer 19 or the upper electrode 21 to be formed later, if a step coverage is not sufficient when the organic electroluminescence layer 19 or the upper electrode 21 is formed, it becomes easy for the organic electroluminescence layer 19 or the upper electrode 21 to be disrupted at the lateral side of the opening portion of the protection layer 15. On the other hand, as illustrated in FIG. 7C, if a side etching width W2 of the protection layer 15 is significantly wider than as in the case of FIG. 7B, the organic electroluminescence layer 19 cannot filled in the indentation of the protection layer 15 formed by the side etching. Thus, a support for supporting the organic electroluminescence layer 19 is not present near the indentation. As a result, as illustrated in FIG. 7D, the organic electroluminescence layer 19 is easy to be disrupted into an organic electroluminescence layer 19a, an organic electroluminescence layer 19b, and an organic electroluminescence layer 19c due to the indentation thereof.

Figure 7E:
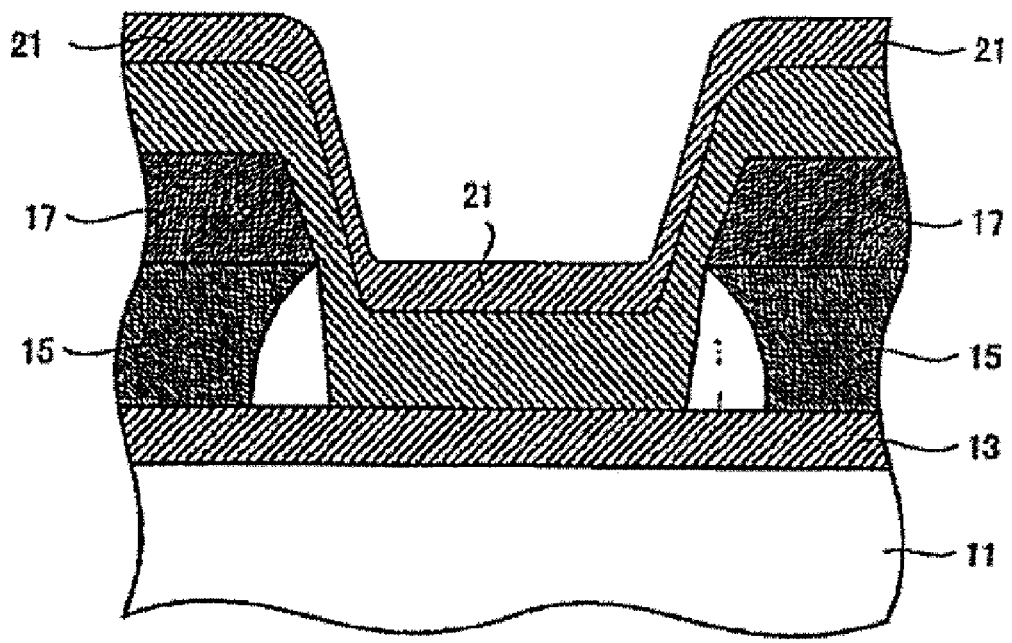

On the other hand, as illustrated in FIG. 7E, even if the organic electroluminescence layer 19 is not disrupted, the organic electroluminescence layer 19 does not enter into the indentation of the protection layer 15 formed by the side etching and a void in the indentation is formed. Thus, the organic electroluminescence layer 19 becomes easy to be peeled off around the void. Further, when stress between the organic electroluminescence layer 19 disposed at the upper side of the interlayer-insulation layer 17 and the protection layer 15 disposed at the lower side of the interlayer-insulation layer 17 is unbalanced due to the void, the interlayer-insulation layer 17 may deform its shape.

However, in the present embodiment, the side etching width W1 can be 1 μm or less by selectively removing the protection-material layer 15a as illustrated in FIG. 7B, thereby satisfactorily preventing such a problem.

Figure 8:
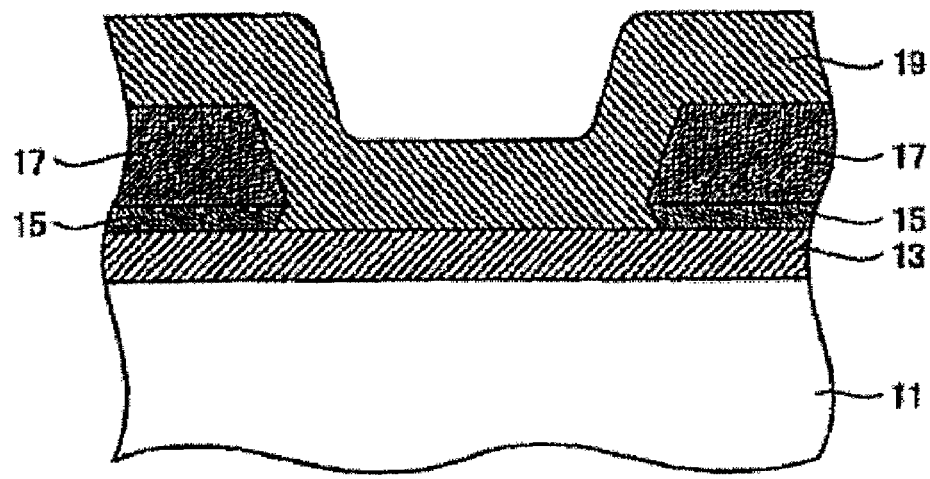
FIGS. 8 and 9 are cross-sectional views explaining a manufacturing method of an organic EL element according to the first embodiment of the present invention.

Next, as illustrated in FIG. 8, the organic electroluminescence layer 19 is formed on the lower electrode 13 and the interlayer-insulation layer 17. In this case, the film thickness of the organic electroluminescence layer 19 has to be greater than that of the protection layer 15. When the film thickness of the organic electroluminescence layer 19 is greater than that of the protection layer 15, even if a step coverage of the organic electroluminescence layer 19 is poor, the organic electroluminescence layer 19 can be effectively prevented from disruption at the lateral side of the opening portion of the protection layer 15. Further, when the indentation of the protection layer 15 is filled with the organic electroluminescence layer 19, the peeling off of the organic electroluminescence layer 19 and the shape deformation of the interlayer-insulation layer 17 which are caused by the indentation can be effectively prevented.

Figure 9:
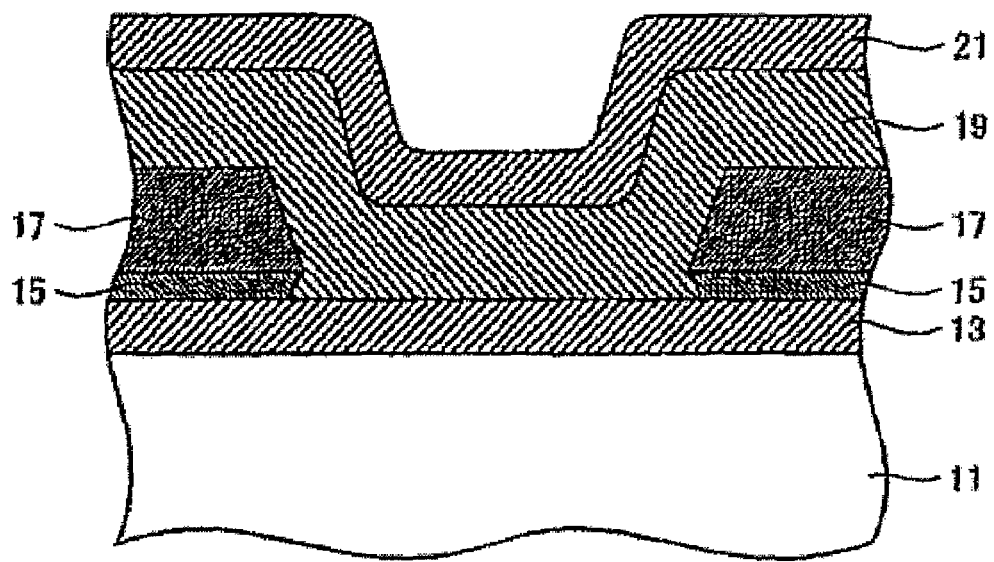

As illustrated in FIG. 9, the upper electrode 21 is formed on the organic electroluminescence layer 19. In this case, the film thickness of the upper electrode 21 has to be greater than that of the protection layer 15. When the film thickness of the upper electrode 21 is greater than that of the protection layer 15, even if a step coverage of the upper electrode 21 is poor, the upper electrode 21 can be effectively prevented from disruption at the lateral side of the opening portion of the protection layer 15. Further, even when the film thickness of the organic electroluminescence layer 19 is relatively thin, the indentation of the protection layer 15 is filled with the organic electroluminescence layer 19. As a result, the peeling off of the upper electrode 21 and the shape deformation of the interlayer-insulation layer 17 which are caused by the indentation can be effectively prevented.

Accordingly, the high quality organic EL element of FIG. 1 can be achieved in which deterioration in quality of the organic EL element that occurs when process damage takes place in an electrode during manufacturing, and poor conductivity of the electrode can be prevented by forming a new protection layer.

Although the upper electrode 21 and the lower electrode 13 are used as a cathode electrode and the anode electrode, respectively, in the aforementioned embodiment, the upper electrode 21 and the lower electrode 13 may be used as an anode electrode and a cathode electrode, respectively.

Second Embodiment

Figure 10:
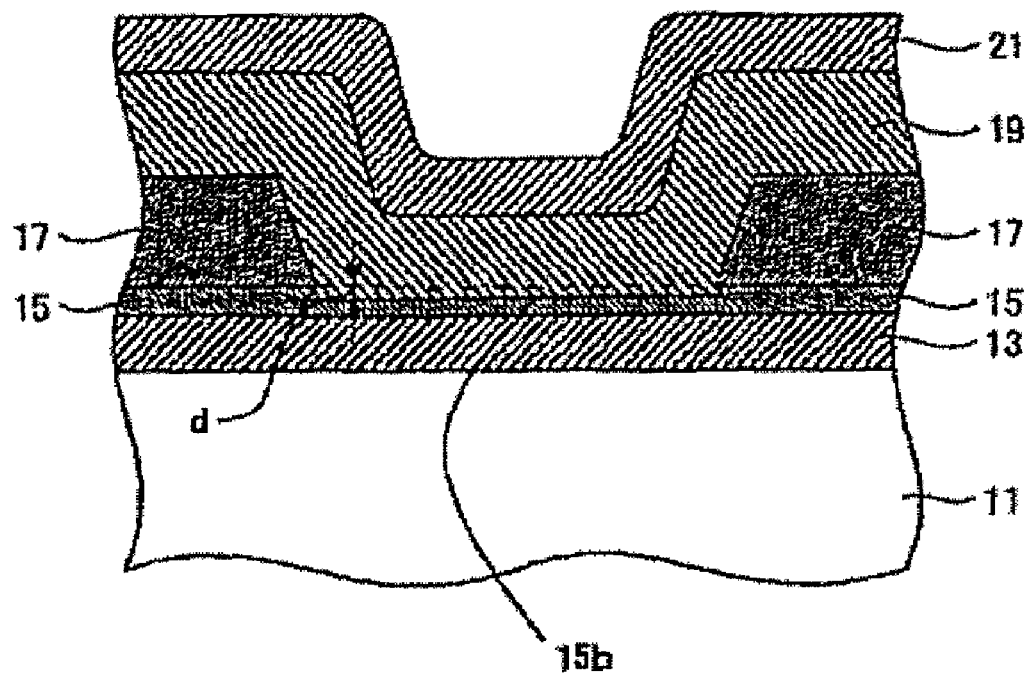
FIG. 10 is a cross-sectional view showing a structure of an organic EL element according to a second embodiment of the present invention.

FIG. 10 is a cross-sectional view showing a structure of the organic EL element according to a second embodiment of the present invention. The following description will focus on a different structure from the organic EL element according to the first embodiment of the present invention, and the rest of common structures will be basically omitted.

Unlike the first embodiment, in the second embodiment, the protection-material layer 15a existing within the opening portion of the interlayer-insulation layer 17 is not entirely removed, instead thereof, the protection-material layer 15a existing within the opening portion of the interlayer-insulation layer 17 remains so as to form a concave portion 15b in the protection layer 15. As a result, the film thickness of the protection layer 15 within an inner area of the opening portion of the interlayer-insulation layer 17 is less than that of the protection layer 15 outside the opening portion of the interlayer-insulation layer 17.

With this structure, the protection layer 15 remains on the lower substrate 13 within the opening portion. Thus, there is an advantage in that the lower substrate 13 has less damage than in the first embodiment when the protection-material layer 15a is etched.

If the film thickness of the protection layer 15 is great in an area where the concave portion 15b is formed, light reflectance tends to decrease at the lower electrode 13 when the organic EL element employs the top emission type. Thus, it is preferable that the film thickness of the protection layer 15 is set to 10 nm or less in the area where the concave portion 15b is formed.

Since a depth d of the concave portion 15b of the protection layer 15 is set to be less than the film thickness of the organic electroluminescence layer 19, the organic electroluminescence layer 19 can be effectively prevented from disruption caused by the step difference of the concave portion 15b of the protection layer 15.

Further, since the depth d of the concave portion 15b of the protection layer 15 is set to be less than the film thickness of the upper electrode 21, the upper electrode 21 can be effectively prevented from the disconnection caused by the step difference at a lateral side of the concave portion 15b of the protection layer 15. In addition, poor conductive of the upper electrode 21 can be effectively prevented.

Furthermore, since the lateral side of the concave portion 15b of the protection layer 15 is deviated to outside the lateral side of the insulation layer 17, and its positional deviation width is no more than 1 μm, the organic electroluminescence layer 19 can be effectively prevented from peeling off caused by a void which is generated when the organic electroluminescence layer 19 does not to enter into the indentation of the protection layer 15 formed by the side etching.

The organic EL element of the present invention is particularly useful for a color flat display device requiring high quality such as a display panel, an out-door screen, or a screen for a personal computer or a television set.

What is claimed is:

1. An organic EL element comprising:
   a first electrode;
   a protection layer that is formed on the first electrode and has a first opening portion through which the first electrode is exposed;
   an insulation layer formed on the protection layer and having a second opening portion and an upper surface around an opening of the second opening portion, the second opening portion being formed in a region corresponding to the first opening portion of the protection layer;
   an organic layer that is formed on lateral sides of the first opening portion and the second opening portion, the upper surface of the insulation layer, and the first electrode exposed through the first opening portion, and includes an emission layer; and
   a second electrode formed on the organic layer,
   wherein a film thickness of the protection layer is less than that of the organic layer.

2. The organic EL element according to claim 1, wherein the film thickness of the protection layer is less than that of the second electrode.

3. The organic EL element according to claim 1, wherein a film thickness of the insulation layer is tapered toward the second opening portion.

4. The organic EL element according to claim 1, wherein the lateral side of the first opening portion of the protection layer is deviated to outside the lateral side of the second opening portion of the insulation layer, and the deviation width is no more than 1 μm.

5. The organic EL element according to claim 1, wherein the first electrode is formed of aluminum, an aluminum alloy, silver, or a silver alloy, and the protection layer is formed of molybdenum.

6. An organic EL element comprising:
   a first electrode;
   a protection layer formed on the first electrode and having a concave portion;
   an insulation layer formed on the protection layer and having an opening portion and an upper surface around an opening of the opening portion, the opening portion being formed in a region corresponding to the concave portion of the protection layer;
   an organic layer that is formed on lateral sides of the concave portion and the opening portion of the insulation layer, the upper surface of the insulation layer, and the protection layer exposed through the opening portion of the insulation layer, and includes an emission layer; and
   a second electrode formed on the organic layer,
   wherein a depth of the concave portion is less than a film thickness of the organic layer.

7. The organic EL element according to claim 6, wherein the depth of the concave portion of the protection layer is less than the film thickness of the second electrode.

8. The organic EL element according to claim 6, wherein the lateral side of the concave portion of the protection layer is further deviated outside the lateral side of the opening portion of the insulation layer, and the deviation width is no more than 1 μm.

9. The organic EL element according to claim 6, wherein a film thickness of the insulation layer is tapered toward the opening portion.

10. The organic EL element according to claim 6, wherein the first electrode is formed of aluminum, an aluminum alloy, silver, or a silver alloy, and the protection layer is formed of molybdenum.

11. An organic EL element comprising:
    a first electrode;
    a protection layer formed on the first electrode and having a concave portion;
    an insulation layer formed on the protection layer and having an opening portion through which the protection layer is exposed;
    an organic layer that is formed over the insulation layer and the protection layer exposed through the opening portion of the insulation layer, and includes an emission layer; and
    a second electrode formed on the organic layer,
    wherein a depth of the concave portion is less than a film thickness of the organic layer, and the protection layer in a region where the concave portion is formed has a thickness of not more than 10 nm.

* * * * *